United States Patent [19]
Aubert

[11] Patent Number: 4,876,503
[45] Date of Patent: Oct. 24, 1989

[54] METHOD OF MEASURING THE INTENSITY OF A DC CURRENT AND A DEVICE IMPLEMENTING THIS METHOD

[75] Inventor: Guy Aubert, Grenoble, France
[73] Assignee: Thomson-CGR, Paris, France
[21] Appl. No.: 901,512
[22] PCT Filed: Nov. 29, 1985
[86] PCT No.: PCT/FR85/00343
    § 371 Date: Oct. 3, 1986
    § 102(e) Date: Oct. 3, 1986
[87] PCT Pub. No.: WO86/03843
    PCT Pub. Date: Jul. 3, 1986
[51] Int. Cl.[4] .................. G01R 33/00; G01R 15/00
[52] U.S. Cl. .............................. 324/117 R; 324/127; 324/105
[58] Field of Search ............. 324/127, 117 R, 117 H, 324/105, 225, 320

[56] References Cited

U.S. PATENT DOCUMENTS

| | | | |
|---|---|---|---|
| 466,087 | 12/1891 | Weston | 324/105 |
| 548,230 | 10/1895 | Shallenberger | 324/105 |
| 2,836,791 | 5/1958 | Kaplan | 324/117 R |
| 2,845,595 | 7/1958 | Leete | 324/117 R |
| 3,250,995 | 5/1966 | Kalinowski et al. | 324/105 |
| 4,138,641 | 2/1979 | Karlin et al. | 324/117 H |
| 4,672,972 | 6/1987 | Berke | 324/318 |
| 4,683,434 | 7/1987 | Tschopp | 324/320 |

FOREIGN PATENT DOCUMENTS 3045314 9/1982 Fed. Rep. of Germany .

OTHER PUBLICATIONS

Patents Abstracts of Japan, vol. 7, No. 198, (P-220)(1343), Sep. 2, 1983, & JP, A, 5897663 (MITSUBISHI DENKI K.K.), Jun. 10, 1983, voir resume.
Soviet Journal of Instrumentation and Control, No. 9, Sep. 1969, Oxford, (GM), L. K. Dondoshanshkii et al.: "A Device for Converting Current to Magnetic Induction for a Nuclear Magnetic Resonance Frequency Converter", pp. 61-62, voir l'article en entier.
Control Engineering, vol. 26, No. 9, Sep. 1979, N.Y., (US), "A Calibration Standard for High DC currents", p. 39, voir l'article en entier.

*Primary Examiner*—Ernest F. Karlsen
*Attorney, Agent, or Firm*—Oblon, Spivak, McClelland, Maier & Neustadt

[57] ABSTRACT

A method of measuring the strength of a DC current and a device for implementing this method are provided, forming an NMR shunt for measuring high currents. A magnetic coil is placed in series in the circuit in which the current to be measured flows, the temperature of the magnet is stabilized and the magnetic field is measured in the center of the magnet using an NMR probe.

8 Claims, 3 Drawing Sheets

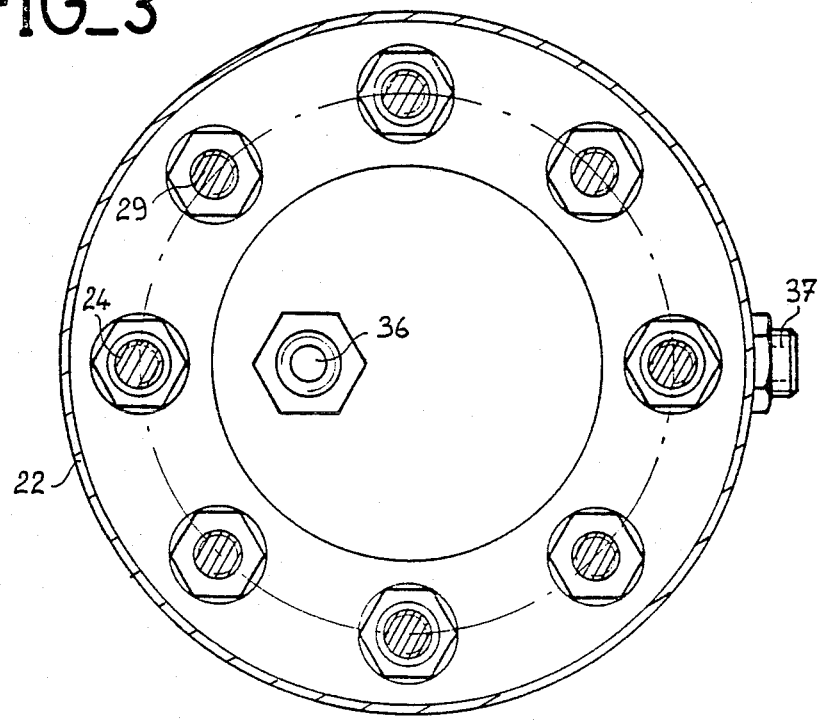
FIG_3
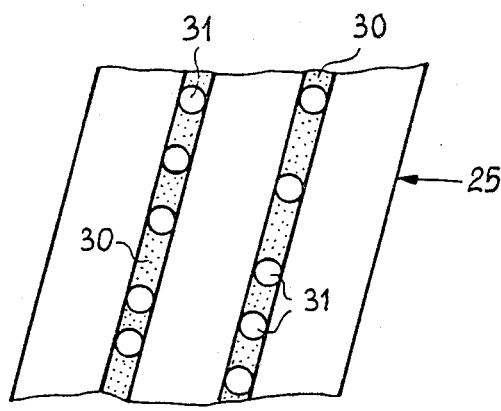
FIG_4

METHOD OF MEASURING THE INTENSITY OF A DC CURRENT AND A DEVICE IMPLEMENTING THIS METHOD

BACKGROUND OF THE INVENTION

The invention relates to a method of measuring the intensity of a DC current, particularly a high current; it also relates to a device implementing this method.

An electric current is traditionally measured by using a shunt, that is to say a device based on Ohm's law. Consequently, in order to be measurable, the voltage drop across the shunt must be significant and this voltage drop is also directly related to the dissipation by Joule effect of the shunt itself. Since any resistive material is related to a temperature coefficient, the temperature variations of the shunt cause systematic errors in measuring the current. This problem is particularly important for measuring high currents where the shunts are bulky and expensive sub assemblies. The purpose of the invention is to overcome this type of problem.

For this, the invention provides a method for measuring the intensity of a DC current flowing in the circuit, in which method said current is caused to flow in a magnetic coil for creating a magnetic field in a given volume of space, in determining at least the temperature of said coiled magnet and measuring the value of the magnetic field in said given volume, this value being representative of the strength of the current, knowing said temperature.

So as to have a more direct measurement of the strength of the current, the temperature of the magnetic coil may be stabilized by simple means. Furthermore, the magnetic field will be measured preferably by using the nuclear magnetic resonance phenomenon on a sample of chosen atoms, placed in a zone where the above mentioned magnetic field has a field sufficient homogeneity for using said phenomenon.

The invention also relates to a device for measuring the strength of a DC current flowing in a circuit, including a magnetic coil intended to be inserted in series in said circuit for generating a magnetic field in at least a given volume of space, means for determining at least the temperature of said magnet and means for measuring the magnetic field in said given volume.

Means will preferably be provided for stabilizing the temperature of the magnet, for example a control line regulating the temperature of a fluid cooling said magnet. As mentioned above, the magnetic coil will be preferably formed so that the magnetic field is sufficiently homogeneous in said given volume for allowing a nuclear magnetic resonance phenomenon to be used, and an NMR probe, known per se, will be placed in said given volume for measuring the value of the magnetic field.

BRIEF DESCRIPTION OF THE DRAWINGS

The invention will be better understood and other advantages thereof will appear from the following description of a devide conforming to its principle, given solely by way of example with reference to the accompanying drawings in which:

FIG. 3 is a section through III—III of FIG. 2;

FIG. 4 is a detail view of the turns of said magnetic coil.

DESCRIPTION OF THE PREFERRED EMBODIMENT

Figure 1:
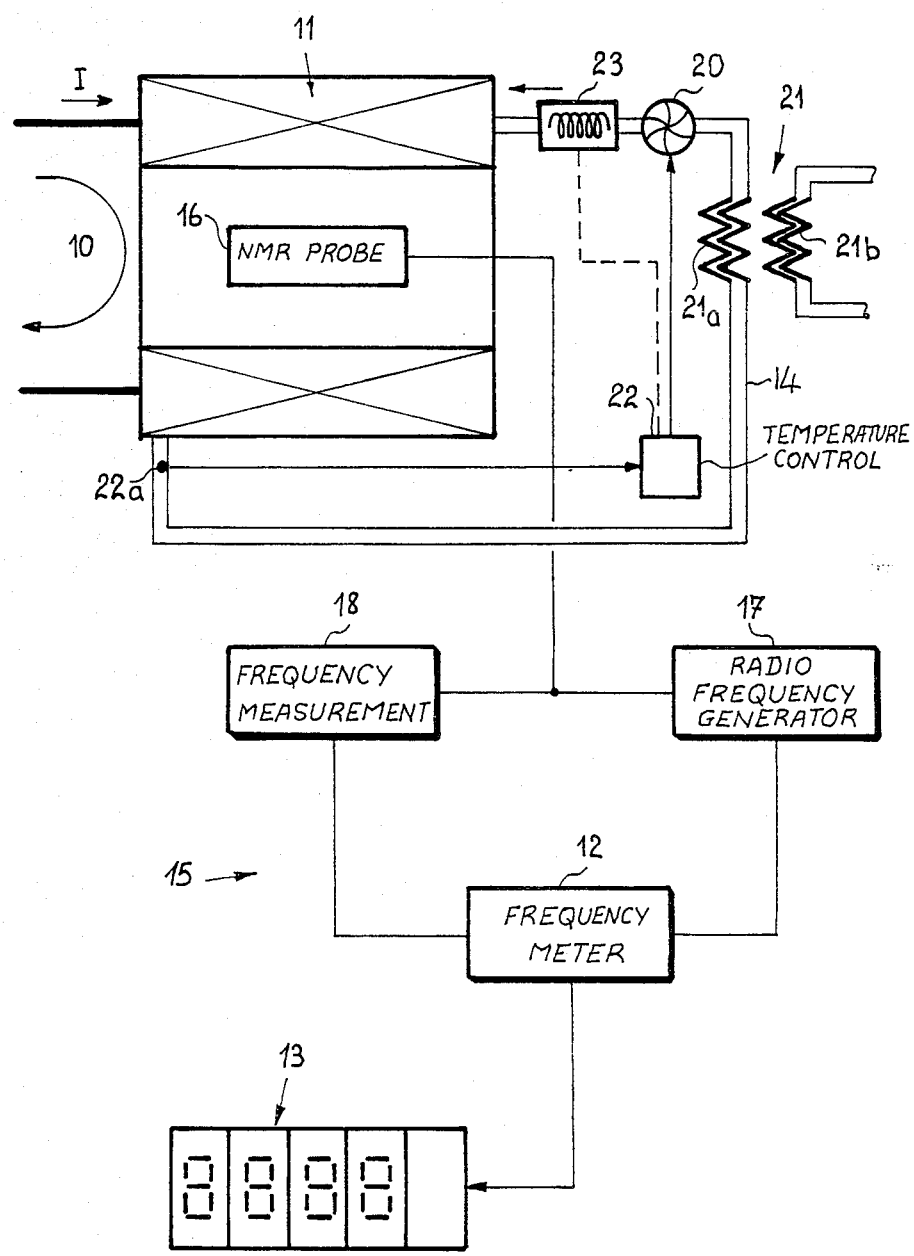
FIG. 1 is a block diagram of a device formed in accordance with the principal of the invention.

Referring to the drawings, a device has been shown in FIG. 1 for measuring the current I flowing in the electric circuit 10 and including a magnetic coil 11, inserted electrically in series in circuit 10, a cooling fluid flow circuit 14 coupled thermally to said magnet and means 15 for measuring the magnetic field created by said magnet in the center of the coil.

More precisely, the measuring means 15 include an NMR probe 16 placed in the center of the magnetic field zone created by the magnet and, in the example, a radio frequency generator 17 as well as means 18 for measuring the radio frequency signal at the terminals of the NMR probe 16. All the elements forming the magnetic field measuring means are well known and are commercially available, particularly for spectrometry applications, such as shown in "a calibration standard for high DC currents" *Control Engineering* vol. 26, no. 9, Sept. 19, 1978, page 39. The NMR probe comprises a sample of chosen atoms and a coupling coil surrounding said sample. The radio frequency generator 17 feeds the coupling coil and emits a signal at a frequency variable in time. A sweep of a certain frequency range including the NMR frequency of the sample is therefore applied to the probe and repeated cyclically. Furthermore, the means 18 for measuring the radio frequency signal detect the value of the radio frequency signal at the terminals of the coupling coil. With this arrangement, the NMR frequency of the sample, representative of the current I, may be determined as will be explained further on.

Magnet 11, which will be described in detail further on, is constructed so as to generate a sufficiently uniform magnetic field in the whole volume occupied by the probe 16, so as to obtain a detectable NMR phenomenon. It is further arranged for the cooling fluid flowing in its internal structure to be thermally coupled to the coil of magnet 11. The flow circuit 14 further includes a variable delivery pump 20 and the secondary circuit 21a a heat exchanger 21. The primary circuit 21b of this exchanger receives another colder flowing fluid. For implementing the invention, it will be sufficient to know the temperature of the magnet. A temperature correction could then be applied to the calculation of the intensity from the value of the magnetic field derived from determining the NMR frequency. It is more judicious to stabilize the temperature of the magnet. For that, in the example described, the system may be completed by a temperature control 22 for controlling the pump 20 by a control line, known per se, and interconnected between a temperature probe 22a in thermal contact with the fluid at the outlet of the magnet 11 and means for controlling the delivery of the pump. The temperature of the magnet may also be stabilized by means of an additional heating resistance 23 in thermal contact with the fluid, supplied with power under the control of a similar control line.

Another variant of the system for stabilizing the temperature of the magnet 11 may also be envisaged, in which a liquid in the state of vaporization is caused to flow through the internal structure of the magnet reserved for the flow of the cooling fluid. Cooling of the magnet will then be provided at a constant temperature by the latent heat energy of the liquid. Circuit 12 forming a frequency meter is driven by the measuring means 18 when generator 17 passes through the NMR frequency so as to determine the value of this frequency representative of the value of the magnetic field created by magnet 11. In fact when generator 17 passes through the NMR frequency of the sample, an energy absorption phenomenon occurs and the radio frequency signal at the terminals of said coupling coil is very greatly attenuated. This sudden voltage drop during the frequency sweep is used for elaborating an order for driving the circuit 12, which further receives the frequency delivered by the generator 17. Digital information delivered by circuit 12, representative of this frequency, is converted into a current value and fed to a display means 13. The displayed value is brought up to date at each sweep.

In the system which has just been described, the field $B_0$ created by magnet 11 is directly proportional to the measured NMR frequency and it is of the form:

$$B_O = b(1+aT)I$$

where a and b are constants and T is the temperature of the magnet. Consequently, if the temperature is stabilized, the value of the magnetic field is directly representative of the intensity or strength I of the current which flows through circuit 10.

Figure 2:
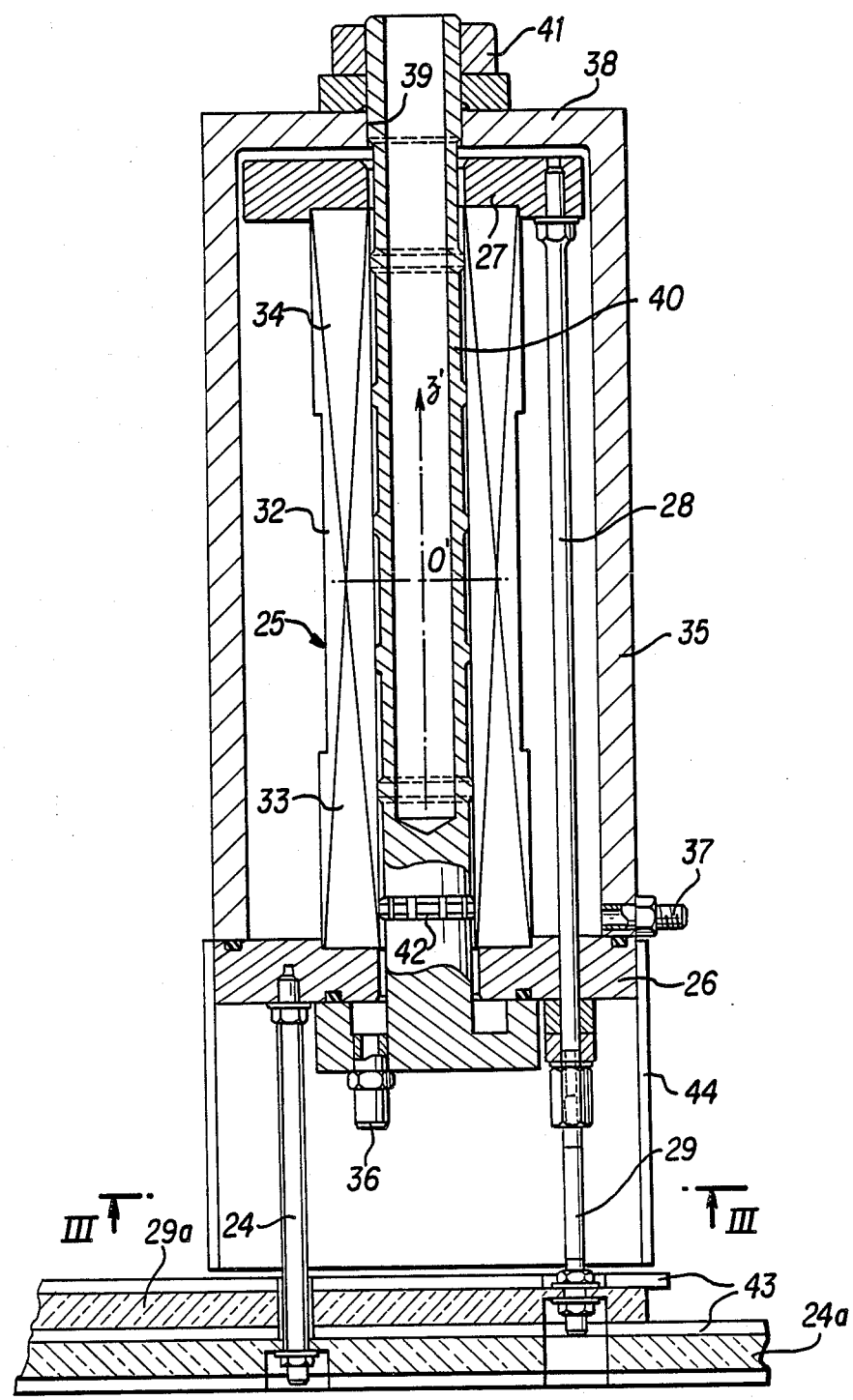
FIG. 2 is a detail view showing the structure of the magnetic coil, in longitudinal section.

With reference to FIGS. 2 to 4 the structure of a magnetic coil suitable for the application contemplated will now be described. This magnet is formed of a coil 25 with helical turns clamped between two metal end flanges 26, 27 (forming annular current distributing plates) by means of tie rods 28 evenly spaced apart over a cylindrical surface coaxial with the longitudinal axis of the coil. The tie rods 28 are in electric contact with flange 27 and isolated electrically from coil 25 and flange 26. Flange 26 is connected electrically by as many metal rods 24 as there are tie rods to an electric connection piece 24a. These rods are disposed over the same cylindrical surface as the tie rods 28 and are equidistant therefrom (see FIG. 3). The ends of tie rods 28 are extended by as many metal rods 29 connected electrically to another electric connecting piece 29a parallel to piece 24a, the rods 24 are insulated from piece 19a through which they pass. The currents flow in opposite directions in rods 24, 29 and pieces 24a, 29a so that the magnetic field which they create in the vicinity of the center O' of the magnet is negligible. Plates of insulating material 43 are inserted between the base 44 of the magnet and piece 29a, on the one hand, and between pieces 29a and 24a, on the other. The tie rods 28 participate in the electric connection of coil 25, while compensating for its axial current component due to the helical pitch of the winding.

Structurally, coil 25 results from machining a helix in a cylindrical tubular portion of the metal chosen (longer than the desired coil) and the axial compression of this helix so as to form a coil with jointing turns. These turns are bonded together by insulating bonding agent 30 in which small calibrated glass balls 31 are incorporated maintaining a very small constant dielectric spacing between adjacent turns (see FIG. 4). So as to homogenize the reference field in a zone about the center O', sufficient for receiving the NMR probe 20, the section of the central turns has been modified with respect to that of the end turns. For that, the central portion 32 of the coil is machined so as to give it an outer diameter smaller than that of the two adjacent end portions 33, 34. The length of the central portion 32 and the difference of diameters are chosen so as to obtain the required homogeneity. The coil which has just been described is housed in a sealed case 35 having connecting orifices 36, 37 for insertion thereof in the cooling fluid circuit 14.

More precisely, the cylindrical casing 35 made from an insulating material is completely open at one of its axial ends and this end rests on the edge of flange 26, which is larger than flange 27. The other axial end of the case has a wall 38 pierced with a hole 39 for fastening therethrough an insulating hollow mandrel 40 inside which the probe 20 will be housed. This mandrel includes a shoulder at one end, bearing against the external surface of flange 26 and in which the orifice 36 is formed. Its other end has a threaded part projecting out of hole 39 and a nut 41 is engaged on this threaded part, tightening thereof causing the sealed closure of case 35. Mandrel 40 has on its external surface a grooved annular release 42, maintaining an annular passage for the flow of the fluid between the mandrel and the internal surface of coil 25. Since the orifice 37 is formed in the side wall of case 35, the fluid is in thermal contact with the internal and external walls of coil 25 so that this latter is always at the temperaure of the cooling fluid.

By way of example, a magnet such as shown in FIGS. 2 to 4 and having the required field homogeneity qualities includes a coil 25 made from copper having the following characteristics:

total length: 310 mm
internal diameter: 38 mm
length of the central portion : 137.54 mm
external diameter of the central portion: 81.42 mm
external diameter of the end portions: 92 mm.

What is claimed is:

1. A device for measuring the intensity of a DC current flowing in a circuit, including a magnetic coil intended to be inserted in series in said circuit for generating a magnetic field in a given volume of space, means for determining at least the temperature of said coil, means for stabilizing the temperature of said coil, means for measuring the magnetic field in said given volume and means for linearly determining said intensity from said measurement of the magnetic field and from said temperature.

2. The device as claimed in claim 1, wherein said magnetic coil is constructed so that the magnetic field is sufficiently homogeneous in said given volume for using a NMR phenomenon and said means for measuring the magnetic field include an NMR probe, known per se, placed in said given volume.

3. The device as claimed in claim 1, wherein said magnetic coil is combined with a fluid flow structure establishing a good thermal coupling between said magnet and said fluid, this fluid flow structure being inserted in a fluid flow circuit including a pump and a heat exchanger, said device further including means for regulating the temperature of said fluid.

4. The device as claimed in claim 1, wherein said magnetic coil is combined with a fluid flow structure establishing a good thermal coupling between said magnet and said fluid, and said flow structure is inserted in a circuit in which flows a liquid which is vaporizing.

5. The device as claimed in claim 1, wherein said magnetic coil includes a coil with helical turns clamped between two metal end flanges by tie rods spaced evenly apart over a surface coaxial with a longitudinal axis of said coil and said tie rods are in electric contact with one of the flanges and electrically insulated from said coil and from the other flange, so as to participate in the electrical connection of said coil while compensating for the axial component of the current vector due to the helical pitch of said coil.

6. The device as claimed in claim 5, wherein said coil with helical turns is formed by machining a helix in a cylindrical tubular portion and by axially compressing this helix.

7. The device as claimed in claim 5, wherein the turns of said coil are bonded together with an insulating bonding agent containing calibrated glass balls.

8. The device as claimed in claim 6, wherein a central portion of said coil has an external diameter smaller than that of the two adjacent end portions for improving the homogeneity of the magnetic field inside said coil.

* * * * *